United States Patent
Jiang et al.

(10) Patent No.: US 8,430,537 B2
(45) Date of Patent: Apr. 30, 2013

(54) TOTAL INTERNAL REFLECTION LENS FOR COLOR MIXING

(75) Inventors: Wu Jiang, Sunnyvale, CA (US);
Xiantao Yan, Palo Alto, CA (US);
Zequn Mei, Fremont, CA (US)

(73) Assignee: Ledengin, Inc., San Jose, CA (US)

( * ) Notice: Subject to any disclaimer, the term of this patent is extended or adjusted under 35 U.S.C. 154(b) by 680 days.

(21) Appl. No.: 12/577,583

(22) Filed: Oct. 12, 2009

(65) Prior Publication Data

US 2010/0091491 A1 Apr. 15, 2010

Related U.S. Application Data

(60) Provisional application No. 61/105,407, filed on Oct. 14, 2008.

(51) Int. Cl.
*F21V 3/00* (2006.01)

(52) U.S. Cl.
USPC ............... 362/311.01; 362/235; 362/311.02; 362/311.03; 359/642; 359/737

(58) Field of Classification Search ............... 362/235, 362/311.01–311.03; 359/642, 737
See application file for complete search history.

(56) References Cited

U.S. PATENT DOCUMENTS

| | | | |
|---|---|---|---|
| 4,698,730 A | 10/1987 | Sakai et al. | |
| 5,742,120 A | 4/1998 | Lin | |
| 5,959,316 A | 9/1999 | Lowery | |
| 6,307,160 B1 | 10/2001 | Mei et al. | |
| 6,351,069 B1 | 2/2002 | Lowery et al. | |
| 6,608,332 B2 | 8/2003 | Shimizu et al. | |
| 6,610,563 B1 | 8/2003 | Waitl et al. | |
| 6,614,179 B1 | 9/2003 | Shimizu et al. | |
| 6,642,652 B2 | 11/2003 | Collins, III et al. | |

(Continued)

FOREIGN PATENT DOCUMENTS

| JP | H9-321341 A | 12/1997 |
|---|---|---|
| JP | H11-298035 A | 10/1999 |

(Continued)

OTHER PUBLICATIONS

International Search Report & Written Opinion of PCT Application No. PCT/US2009/060525, date of mailing Dec. 2, 2009, 10 pages total.

(Continued)

*Primary Examiner* — Stephen F Husar
*Assistant Examiner* — Meghan Dunwiddie
(74) *Attorney, Agent, or Firm* — Kilpatrick Townsend & Stockton LLP

(57) ABSTRACT

A total-internal-reflection (TIR) lens for color mixing includes a body member having an outer surface and an interior open channel extending longitudinally through the body member. The body member and the interior open channel are substantially symmetric with respect to an optical axis, and the outer surface is shaped to provide total internal reflection. The body member has a first end surface region at a first end of the open channel for accommodating a light source and a second end surface region opposite the first end region. The second end surface region includes a plurality of refractive surface regions positioned around the second end region of the open channel. The lens is configured to provide projected light substantially centered with respect to the optical axis when the light source is positioned off the optical axis. In a specific embodiment, a lighting apparatus for providing centered white light includes such a lens and a plurality of light sources.

17 Claims, 14 Drawing Sheets

U.S. PATENT DOCUMENTS

| | | | |
|---|---|---|---|
| 6,680,128 B2 | 1/2004 | Mei | |
| 6,791,116 B2 | 9/2004 | Takahashi et al. | |
| 6,828,170 B2 | 12/2004 | Roberts et al. | |
| 7,064,353 B2 | 6/2006 | Bhat | |
| 7,139,125 B1 | 11/2006 | Mi | |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 7,670,872 B2 | 3/2010 | Yan | |
| 2001/0015778 A1 | 8/2001 | Murade et al. | |
| 2002/0015013 A1 | 2/2002 | Ragle | |
| 2002/0079837 A1 | 6/2002 | Okazaki | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 | 7/2003 | Yamanaka et al. | |
| 2003/0227249 A1 | 12/2003 | Mueller et al. | |
| 2003/0230977 A1 | 12/2003 | Epstein | |
| 2004/0004437 A1 | 1/2004 | Shimizu et al. | |
| 2004/0036081 A1 | 2/2004 | Okazaki | |
| 2004/0051111 A1 | 3/2004 | Ota et al. | |
| 2004/0079957 A1 | 4/2004 | Andrews et al. | |
| 2004/0084687 A1 | 5/2004 | Hohn et al. | |
| 2004/0102061 A1 | 5/2004 | Watanabe | |
| 2004/0114393 A1 | 6/2004 | Galli | |
| 2004/0126918 A1 | 7/2004 | Kurahashi et al. | |
| 2004/0129946 A1 | 7/2004 | Nagai et al. | |
| 2004/0150991 A1 | 8/2004 | Ouderkirk et al. | |
| 2004/0173810 A1 | 9/2004 | Lin et al. | |
| 2004/0188697 A1 | 9/2004 | Brunner et al. | |
| 2004/0201025 A1 | 10/2004 | Barnett et al. | |
| 2004/0207998 A1 | 10/2004 | Suehiro et al. | |
| 2004/0257496 A1 | 12/2004 | Sonoda et al. | |
| 2005/0035364 A1 | 2/2005 | Sano et al. | |
| 2005/0062140 A1 | 3/2005 | Leung et al. | |
| 2005/0093146 A1 | 5/2005 | Sakano | |
| 2005/0145872 A1 | 7/2005 | Fang et al. | |
| 2005/0179376 A1 | 8/2005 | Fung et al. | |
| 2005/0199900 A1 | 9/2005 | Lin et al. | |
| 2005/0221519 A1 | 10/2005 | Leung et al. | |
| 2005/0224829 A1 | 10/2005 | Negley et al. | |
| 2005/0224830 A1 | 10/2005 | Blonder et al. | |
| 2005/0253242 A1 | 11/2005 | Costello et al. | |
| 2005/0270666 A1 | 12/2005 | Loh et al. | |
| 2005/0286131 A1 | 12/2005 | Saxena et al. | |
| 2006/0012299 A1 | 1/2006 | Suehiro et al. | |
| 2006/0063287 A1 | 3/2006 | Andrews | |
| 2006/0082296 A1 | 4/2006 | Chua et al. | |
| 2006/0082679 A1 | 4/2006 | Chua et al. | |
| 2006/0091788 A1 | 5/2006 | Yan | |
| 2006/0097385 A1 | 5/2006 | Negley | |
| 2006/0102914 A1 | 5/2006 | Smits | |
| 2006/0105484 A1 | 5/2006 | Basin | |
| 2006/0105485 A1 | 5/2006 | Basin | |
| 2006/0170332 A1 | 8/2006 | Tamaki et al. | |
| 2006/0284209 A1 | 12/2006 | Kim et al. | |
| 2006/0289050 A1 | 12/2006 | Alley et al. | |
| 2007/0081360 A1 | 4/2007 | Bailey et al. | |
| 2007/0090375 A1 | 4/2007 | Kobilke | |
| 2007/0152212 A1 | 7/2007 | Cho et al. | |
| 2007/0194341 A1 | 8/2007 | Chang et al. | |
| 2007/0215893 A1 | 9/2007 | Liao et al. | |
| 2007/0223219 A1 | 9/2007 | Medendorp, Jr. et al. | |
| 2007/0228390 A1 | 10/2007 | Hattori et al. | |
| 2007/0241357 A1 | 10/2007 | Yan | |
| 2007/0278512 A1 | 12/2007 | Loh et al. | |
| 2008/0012036 A1 | 1/2008 | Loh et al. | |
| 2008/0048200 A1 | 2/2008 | Mueller et al. | |
| 2008/0308825 A1 | 12/2008 | Chakraborty et al. | |

FOREIGN PATENT DOCUMENTS

| | | |
|---|---|---|
| JP | 2000-349346 | 12/2000 |
| JP | 2000-349347 | 12/2000 |
| JP | 2001-057445 | 2/2001 |
| JP | 2001-168398 A | 6/2001 |
| JP | 2002-185046 | 6/2002 |
| JP | 2004-031508 A | 1/2004 |
| JP | 2004-111937 A | 4/2004 |
| JP | 2004-241704 | 8/2004 |
| JP | 2004-253404 | 9/2004 |
| JP | 2004-259958 A | 9/2004 |
| JP | 2004-266246 A | 9/2004 |
| JP | 2004-274087 A | 9/2004 |
| JP | 2004-282004 A | 10/2004 |

OTHER PUBLICATIONS

Kading, O.W., "Thermal Conduction in Metallized Silicon-Dioxide Layers on Silicon," Applied Physics, Sep. 1994, vol. 65, No. 13, pp. 1629-1631.

Office Action of U.S. Appl. No. 11/824,233, date of mailing Dec. 30, 2009, 20 pages total.

Office Action of Japanese Application No. 2005-315149, dated Jul. 21, 2009, 3 pages total.

"Solvent Soluble Polyimide with High Transparency and High Tg: HOP-400, 500," Hitachi Cable Review, Aug. 2003, No. 22, p. 78.

Yan, Xiantao, "Two Test Specimens for Determining the Interfacial Fracture Toughness in Flip-Chip Assemblies," Jun. 1998, Transactions of the ASME, vol. 120, pp. 150-155.

Yan, Xiantao, "Analysis Based Design Guidelines for Metal Runner and Passivation Layers in IC Packaging," DELPHI Automotive Systems, Analytical Engineering Conference, May 2000, pp. 1-4.

Non-Final Office Action for U.S. Appl. No. 11/796,240, mailed on Dec. 9, 2009, 11 pages.

Notice of Allowance for U.S. Appl. No. 11/260,101, mailed on Nov. 20, 2009, 4 pages.

Non-Final Office Action for U.S. Appl. No. 11/036,559, mailed on Aug. 18, 2009, 15 pages.

Final Office Action for U.S. Appl. No. 11/796,240, mailed on Jul. 15, 2009, 11 pages.

Non-Final Office Action for U.S. Appl. No. 11/260,101, mailed on Jun. 9, 2009, 21 pages.

Non-Final Office Action for U.S. Appl. No. 11/796,240, mailed on Feb. 12, 2009, 6 pages.

Non-Final Office Action for U.S. Appl. No. 11/036,559, mailed on Feb. 3, 2009, 8 pages.

Final Office Action for U.S. Appl. No. 11/260,101 mailed on Dec. 16, 2008, 23 pages.

Requirement for Restriction/Election for U.S. Appl. No. 11/796,240, mailed on Dec. 4, 2008, 5 pages.

Non-Final Office Action for U.S. Appl. No. 11/036,559, mailed on Sep. 16, 2008, 14 pages.

Requirement for Restriction/Election for U.S. Appl. No. 11/796,240, mailed on Aug. 20, 2008, 3 pages.

Non-Final Office Action for U.S. Appl. No. 11/260,101, mailed on Jul. 23, 2008, 18 pages.

Final Office Action for U.S. Appl. No. 11/036,559, mailed on May 15, 2008, 17 pages.

Final Office Action for U.S. Appl. No. 11/260,101, mailed on May 13, 2008, 16 pages.

Non-Final Office Action for U.S. Appl. No. 11/260,101, mailed on Dec. 4, 2007, 11 pages.

Requirement for Restriction/Election for U.S. Appl. No. 11/036,559, mailed on Sep. 19, 2007, 11 pages.

Requirement for Restriction/Election for U.S. Appl. No. 11/036,559, mailed on Aug. 30, 2007, 5 pages.

Requirement for Restriction/Election for U.S. Appl. No. 11/036,559, mailed on Jun. 5, 2007, 5 pages.

Final Office Action for U.S. Appl. No. 11/824,233, mailed on Jul. 20, 2010, 19 pages.

Harper, Charles A.; "Electronic Materials and Processes Handbook;" 2004; The McGraw-Hill Companies; Third Edition; p. 2.39.

Final Office Action for U.S. Appl. No. 11/796,240 mailed on Jun. 29, 2010, 19 pages.

Non-Final Office Action for U.S. Appl. No. 11/036,559, mailed on Apr. 12, 2011, 12 pages.

Non-Final Office Action for U.S. Appl. No. 11/824,233, mailed on Apr. 5, 2011, 22 pages.

Non-Final Office Action for U.S. Appl. No. 11/824,233, mailed on Dec. 30, 2009, 19 pages.

Final Office Action for U.S. Appl. No. 11/796,240, mailed on Jun. 29, 2010, 19 pages.

Final Office Action for U.S. Appl. No. 11/036,559, mailed on Jun. 7, 2010, 11 pages.

Final Office Action for U.S. Appl. No. 11/824,233, mailed on Sep. 16, 2011, 21 pages.

Non-Final Office Action for U.S. Appl. No. 11/824,233, mailed on Jan. 19, 2012, 22 pages.

Office Action of Chinese Application No. 200980103108.0., dated Oct. 10, 2011, 17 pages total (English translation included).

Notice of Allowance for U.S. Appl. No. 11/824,233, mailed on Sep. 12, 2012, 8 pages.

$$z = \frac{cr^2}{1+\sqrt{1-(1+k)c^2r^2}}$$

FIG. 13

| Tolerances for TIR mixing lens | | |
|---|---|---|
| Radius of curvature | +/- | 0.50% |
| EFL | +/- | 1% |
| Center thickness | +/- | 0.020mm |
| Diameter | +/- | 0.020mm |
| Surface figure error | | <2 fringes per inch (2 fringes = 1λ) |
| Surface irregularity | | <1 fringe per inch |
| Scratch-Dig Specification | | 40-20 |
| Surface roughness specification | | <50Å |

FIG. 14

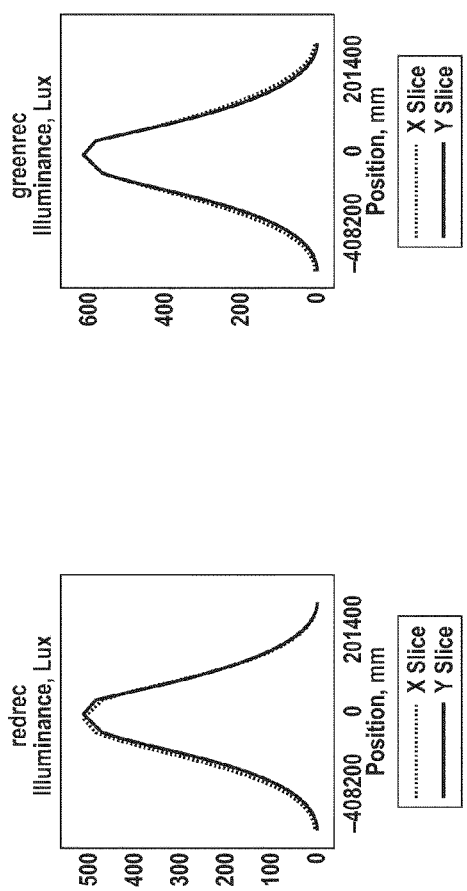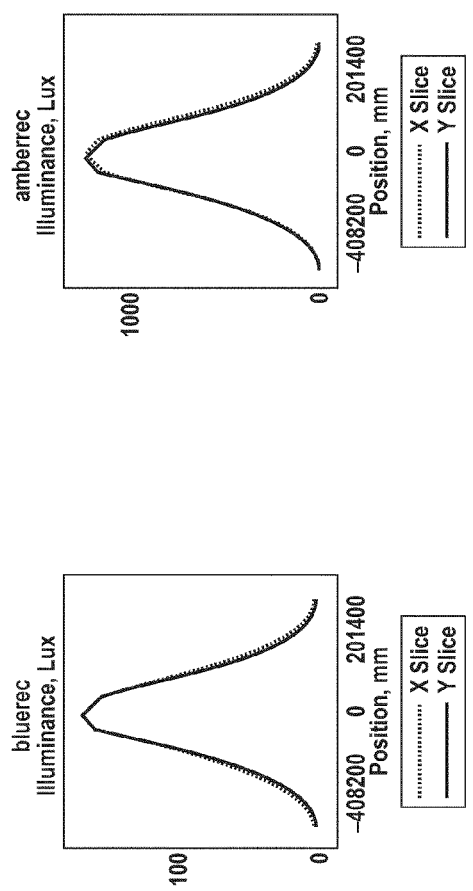
FIG. 17A  FIG. 17B  FIG. 17C  FIG. 17D

TOTAL INTERNAL REFLECTION LENS FOR COLOR MIXING

CROSS-REFERENCES TO RELATED APPLICATIONS

This application claims the benefit of U.S. Provisional Application Ser. No. 61/105,407, filed on Oct. 14, 2008 and entitled "TOTAL INTERNAL REFLECTION LENS FOR COLOR MIXING," which is commonly owned and incorporated by reference herein.

The application is also related to U.S. patent application Ser. No. 11/824,233, filed on Jun. 29, 2007 and entitled "MATRIX MATERIAL INCLUDING AN EMBEDDED DISPERSION OF BEADS FOR A LIGHT-EMITTING DEVICE," which is commonly owned and incorporated by reference herein.

BACKGROUND OF THE INVENTION

The present invention relates generally to lighting apparatus and more particularly to methods and devices for providing centered light output. In some embodiments, improved total-internal-reflection lenses and/or LED packaging methods and materials are to produce centered light even when the light sources may be positioned off an optical axis.

A light-emitting device includes a light source and a package for supporting the light source and directing, focusing, filtering, or enhancing light emitted from the light source. Some examples of light sources include a light-emitting diode (LED), an incandescent lamp, a sapphire crystal light, and a fluorescent lamp.

An LED is a semiconductor device that emits incoherent narrow-spectrum light when electrically biased in the forward direction of the p-n junction. This effect is a form of electroluminescence. The color of the emitted light depends on the composition and condition of the semiconducting material used, and can be infrared, visible or near-ultraviolet. Advantages of LEDs over other lighting sources include compactness, very low weight, low power consumption, simple and inexpensive manufacturing, freedom from burn-out problems, high vibration resistance, and an ability to endure frequent repetitive operations. In addition to having widespread applications for electronic products such as indicator lights and so forth, LEDs also have become an important alternative light source for various applications where incandescent and fluorescent lamps have traditionally predominated.

While LEDs are generally monochromatic, LEDs can also be used produce white light, for example, using phosphors as light "converters." In a typical LED-based white light producing device, an LED that produces a monochromatic visible light is encapsulated in a material containing a compensatory phosphor. The wavelength of the light emitted from the compensatory phosphor is complementary to the wavelength of the light emitted by the LED such that the wavelengths from the LED and the compensatory phosphor mix together to produce white light. For instance, a blue LED-based white light source produces white light by using a blue monochromatic LED and a phosphor that emits a complementary yellow hue when excited by the blue light. In these devices the amount of the phosphor in the encapsulant is carefully controlled such that a fraction of the blue light is absorbed by the phosphor while the remainder passes unabsorbed. The complementary yellow hue of the light emitted by the phosphor and the unabsorbed blue light mix to produce white light.

In another typical LED-based white light producing device, multiple monochromatic LED elements are encapsulated in a transparent material. For example, a red LED element, two green LED elements and a blue LED element can form a red-green-green-blue (RGGB) LED light source. Current can be applied independently to each of the LED elements to adjust the color balance. Thus, a white light can be produced.

Unfortunately, the color balance of the white light can vary depending on the position of the light source or an angle from which the light is viewed, which results in a non-uniform color distribution. Attempts have been made using special mixing lenses to compensate for the non-uniformity of the color distribution. However, while the variation may be reduced, the color still varies noticeably depending on the angle of the emitted illumination, or the angle from which the illumination is received or viewed. Such color non-uniformity can negatively affect designs for light sources such as spot lights and other general lighting applications, and color display technologies such as active matrix thin film transistor liquid crystal displays (TFTLCDs) in applications such as consumer computer and television monitors, projection TVs, large advertising displays. One solution to the problem of color variation is to use a secondary lens with a light mixing design on the light emitting device. Unfortunately, the secondary lens generally causes a 40% to 50% reduction in light intensity output by the light emitting device.

The quality of color, also known as color rendition, is also very important in many applications. For example, medical personnel rely on color for identifying tissues during surgery. One measure of color rendition is the ability of a light source to reproduce the colors of various objects being lit by the source, which can be quantified by a color rendering index (CRI). The best possible rendition of colors is specified by a CRI of 100, while the poorest rendition is specified by a CRI of 0. In applications such as surgery, a CRI of less than 70 results in a drop out of many colors and provides poor illumination, making tissue identification difficult. Typically, a CRI of greater than 80-90 is preferred for medical applications. The CRI of an incandescent light bulb, which emits essentially black body radiation, is nearly one hundred. However, an incandescent lamp also produces a lot of heat. What is needed is a cool light source with a CRI greater than 80-90. While a white light LED source can be adjusted to emit light having a high CRI in one particular direction, what is needed is an LED source that can emit white light having a high CRI uniformly over a wide range of angles.

Given the importance of LEDs as light sources, particularly LEDs using multiple color elements, there is a need for improved lenses and LED packaging methods and materials to alleviate the above-identified problems. There is a further need for methods and materials that can also reduce light lost at large angles and allow LEDs to produce higher optical performance (Lumens/package) from a smaller package or footprint (Lumens/area), which are critical for many light source applications.

As demand for better lighting devices continues to increase, it would be desirable to provide cost effective LED based lighting sources having improved efficiency and brightness.

BRIEF SUMMARY OF THE INVENTION

According to an embodiment of the invention, a total-internal-reflection (TIR) lens for color mixing is provided. The lens includes a body member having an outer surface and an interior open channel extending longitudinally through the body member. The body member and the interior open channel are substantially symmetric with respect to an optical axis, and the outer surface is shaped to provide total internal reflection. The body member has a first end surface region at a first end of the open channel for accommodating a light source and a second end surface region opposite the first end region of the open channel. The second end surface region includes a plurality of refractive surface regions positioned around the second end region of the open channel. In embodiments of the invention, the lens is configured to provide projected light substantially centered with respect to the optical axis when the light source is positioned off the optical axis. In a specific embodiment, a lighting apparatus for providing centered white light includes such a lens and a plurality of light sources.

In a specific embodiment of the lens, the interior open channel is characterized by a substantially cylindrical sidewall. In an embodiment, the side wall of the interior open channel substantially extends from one end of the interior channel to the other end along a straight path without bending or angles. In some embodiments, the side wall forms a small angle, e.g. 1 degree, with the optical axis. In other words, one end of the interior open channel is slightly larger than the other end. This channel configuration can simplify the manufacturing process, such as a plastic molding process.

In certain embodiments, the lens described above can be used with one or more light-emitting-diodes (LEDs) in a lighting apparatus. In a specific embodiment, the lighting apparatus includes a light-emitting diode (LED), a matrix material having a first refractive index overlying the LED, and a dispersion of beads within the matrix material, the beads having a second refractive index different than the first refractive index.

In an embodiment, a lighting apparatus includes a lens as described above and four LEDs: a red LED, a green LED, a blue LED, and an amber LED. In the example, the lighting apparatus is configured to provide substantially centered white light.

According to another embodiment of the invention, a light-emitting device comprises a support, a light source disposed on the support, a matrix material having a first refractive index disposed over the light source. The matrix material includes a dispersion of beads where the beads have a second refractive index different than the first refractive index.

According to another embodiment of the invention, a method is provided for mixing light from two light sources to provide a uniform colored light over a range of angles. The method comprises emitting light from two light sources disposed on a support each light source emitting a different colored light, and transmitting the light from the two light sources through a matrix material having a first refractive index and including beads having a second refractive index dispersed within the matrix material. In some embodiments, the matrix material includes a first glass and the bead material includes a second glass having a higher refractive index and a higher melting point than the first glass. The beads can be less than ten microns in diameter and less that twenty percent of the matrix material by weight.

BRIEF DESCRIPTION OF THE DRAWINGS

FIG. 13 shows an equation that describes an outer surface of a lens according to an embodiment of the present invention;

FIG. 14 lists design parameters for a total-internal-reflection (TIR) lens according to a specific embodiment of the present invention;

FIGS. 17A-17D are simplified line charts illustrating light intensity for four LEDs located in four different off-axis positions, respectively, in a lighting apparatus according to an embodiment of the present invention;

DETAILED DESCRIPTION OF THE INVENTION

Figure 1:
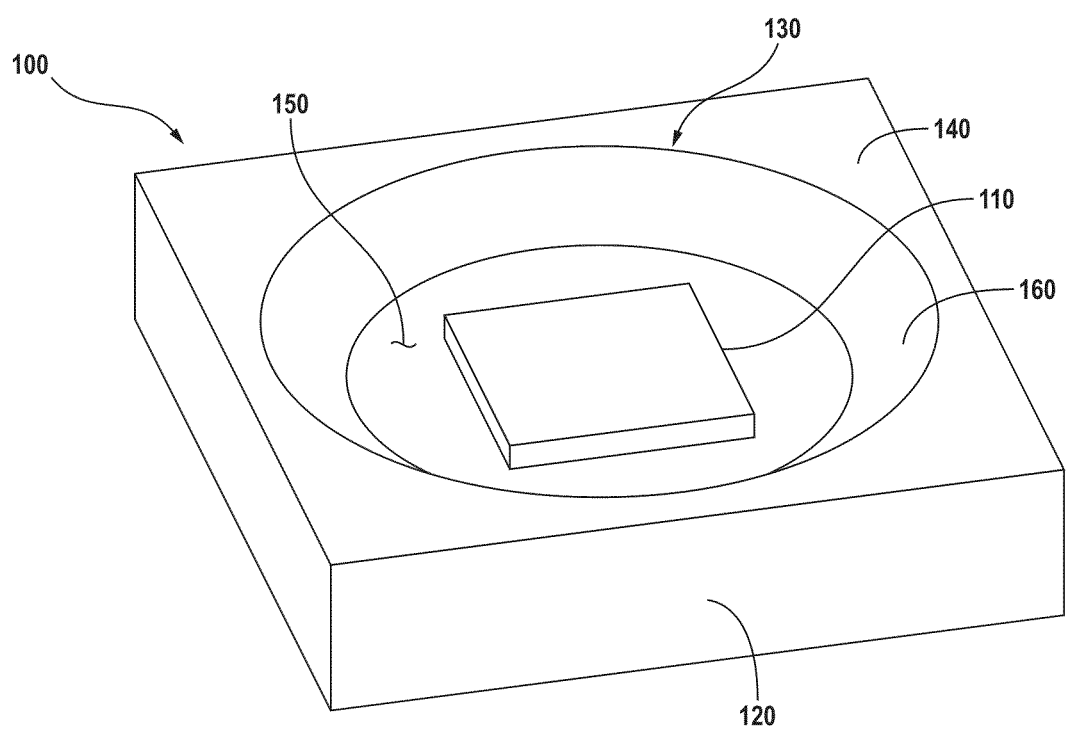
FIG. 1 is a perspective view of an exemplary light-emitting device according to an embodiment of the present disclosure.

The present invention provides methods and devices for providing centered light output in a lighting apparatus. In some embodiments, improved total-internal-reflection lenses and/or LED packaging methods and materials are to produce centered light even when the light sources may be positioned off an optical axis.

In an embodiment, the present invention provides light-emitting devices that include a transparent matrix material encapsulating a light source. The light-emitting devices of the present invention can employ incandescent, sapphire crystal, fluorescent, or LED light sources that operate over the range of wavelengths from ultraviolet (UV) to Infrared (IR) which covers the range from about 200 to 2000 nanometers.

In one example, a light-emitting device includes a plurality of monochromatic LED elements configured to emit light of a plurality of colors. The transparent matrix material includes a dispersion of beads configured to scatter the light emitted by the LED elements as the light traverses the matrix material. The beads provide a uniform mixing of the emitted light such that the colors combined from the individual LEDs appear as a constant color over a range of angles.

In another example, a light-emitting device includes a matrix material and an LED configured to emit a monochromatic light, for example a blue light. The matrix material includes a phosphor configured to absorb a fraction of the blue light and produce a light having a complementary yellow hue, while the remainder of the blue light passes unabsorbed. The complementary yellow hue of the light emitted by the phosphor and the unabsorbed blue light combine to produce white light. The matrix material further includes a dispersion of beads configured to scatter and mix the blue and complementary yellow lights and provide a uniform white light.

A further benefit of using the dispersion of beads is an improved efficiency of the light emission from the light-emitting device. An amount of light emitted from an LED or another light source using the matrix material including the beads is greater than from a similar light-emitting device using a secondary lens with a mixing feature. Improved transmission efficiency also allows for smaller packages to emit as much light as larger inefficient packages, and at lower temperatures. An improved CRI over a wide range of angles is another benefit of including the dispersion of beads in the matrix material.

Accordingly, exemplary light-emitting devices according to the present disclosure may have one or more of the following features: 1) They provide a wide range of angles over which the light-emitting device can provide uniform color and intensity illumination; 2) they offer higher performance by enabling 30% or greater luminosity per LED die as compared to the luminosity of a light emitting device using a secondary lens with a light mixing design; and 3) they provide a uniform CRI over a wide range of angles. In the case of white LED applications, the present disclosure provides embodiments for improving white light LED efficiency. Therefore, the present invention enables a new class of uniform color controlled LED-based light sources and display applications.

FIG. 1 is a perspective view of an exemplary light-emitting device 100 according to an embodiment of the present disclosure. In various embodiments, a light source 110 includes a light-emitting diode (LED), a die including multiple LED elements, a sapphire crystal, a filament light source, and so forth. The light-emitting device 100 comprises a body 120 configured to provide a support for the light source 110. In this embodiment, the body 120 includes a cavity 130 extending downward from a top surface 140 of the body 120. The cavity 130 includes a floor 150 configured for bonding to the light source 110. The light-emitting device 100 further includes a matrix material (discussed below) disposed within the cavity 130. The matrix material encapsulates the light source 110. In some embodiments, the light-emitting device 100 has a square footprint enabling multiple light-emitting devices 100 to be densely arranged in a square array.

In the embodiment shown in FIG. 1, a sidewall 160 of the cavity 130 is inclined at an angle so that the cavity 130 takes the shape of an inverted and truncated cone. The sidewall 160 can also be vertical, or nearly so. In some embodiments the sidewall 160 of the cavity 130 is inclined at a 45° angle. In other embodiments the sidewall 160 takes a parabolic shape and may be coated with a reflective material to redirect and/or focus the light.

Figure 2:
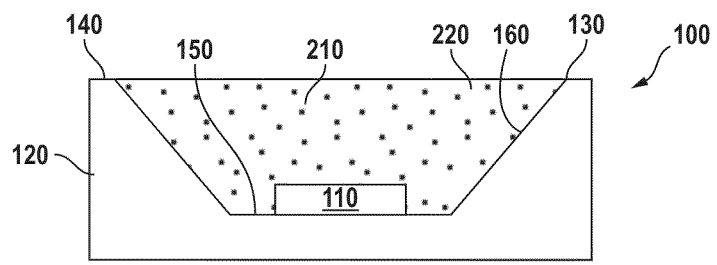
FIG. 2 is a cross-sectional view of the light-emitting device of FIG. 1.
Figure 3:
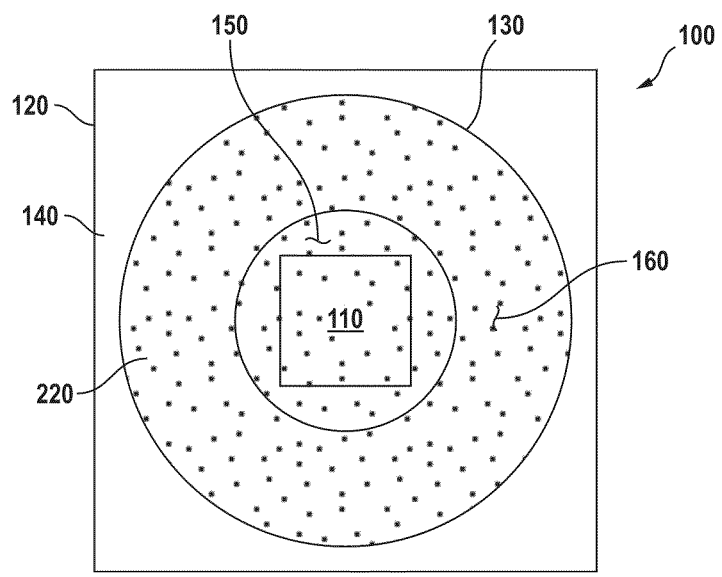
FIG. 3 is a top plan view of the light-emitting device of FIG. 1.

FIG. 2 is a cross-sectional view of the light-emitting device 100 of FIG. 1, and FIG. 3 is a top plan view of the light-emitting device 100 of FIG. 1. The light-emitting device 100 further includes a matrix material 210 disposed with in the cavity 130. The matrix material 210 includes a dispersion of beads 220. In various embodiments, the matrix material 210 include a transparent material, for example, glass, silicone, polymer, epoxy, or plastic. The beads 220 are configured to mix light from the light source 110 and to diffuse transmission of the light through the matrix material 210.

In various embodiments, the beads 220 include a transparent material, for example, glass, silicone, polymer, epoxy, or plastic. A refractive index for the beads 220 is different from a refractive index for the matrix material 210. Generally, the refractive index for the beads 220 is higher than the refractive index for the matrix material 210. In some embodiments, the range for the refractive index of the matrix material 210 includes about 1.40-1.85. Typically the refractive index for the matrix material 210 is in a range of about 1.40-1.60. In some embodiments, the range of the refractive index of the beads 220 includes about 1.40-1.89. Typically the refractive index of the beads 220 is in a range of about 1.44-1.65.

In some embodiments, the matrix material 210 includes a phosphor configured to absorb light at a first wavelength and emit light at a second wavelength. For example, the matrix material may absorb a portion of blue light emitted by the light source 110 and emit light having a complementary yellow hue at a wavelength in the yellow region of the visible light spectrum. The combination of the blue and complementary yellow hue can be adjusted to emit a desired color from the light-emitting device 100. The beads 220 are configured to mix the first wavelength of light from the light source 110 with the second wavelength of light emitted from the matrix material to provide a uniform output of the desired color.

In some embodiments, an amount of beads 220 dispersed within the matrix material 210 is greater than about 1 percent and less than about 80 percent by weight. Typically, the amount of beads 220 dispersed within the matrix material 210 includes a range of about 2 percent to about 10 percent by weight. In some embodiments, a size of the beads 220 includes a range of about 0.3 microns to about 20 microns. Typically, the size of the beads 220 includes a range of about 0.5 microns to about 10 microns. Generally, the beads are dispersed uniformly in the matrix material. In some embodiments, a high speed mixer can be used to disperse the beads uniformly within the matrix material.

In some embodiments, beads 220 comprising a glass having a first refractive index can be dispersed into the matrix material 210 comprising a glass having a second refractive index. A melting point for the glass of the beads 220 that is higher than a melting point for the glass of the matrix material 210 facilitates mixing the beads 220 into the glass of matrix material 210.

Figure 4:
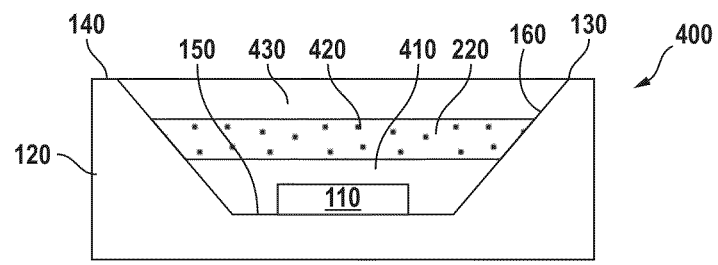
FIG. 4 is a cross-sectional view of a light-emitting device which is an alternate embodiment of the light-emitting device of FIG. 1, illustrating multiple layers of matrix materials.

FIG. 4 is a cross-sectional view of a light-emitting device 400 which is an alternate embodiment of the light-emitting device 100 of FIG. 1, illustrating multiple layers 410, 420, 430 of matrix materials. The light-emitting device 400 can include more layers or fewer layers than the three layers 410, 420, and 430 illustrated in FIG. 4. In some embodiments, the layer 410 includes a thermal insulation matrix material to form a thermal barrier. Examples of the layer 420 include a luminescent matrix material. Examples of the layer 430 include an auxiliary matrix material configured to enclose the cavity 130 from the top.

In some embodiments, one or more layers of the light-emitting device 400 can function as a refractive index matching layer. For example, the refractive index of the layers 410, 420, and 430 can progressively decrease such that the refractive index for the layer 410 is higher than the refractive index for the layer 420, which in turn is higher than the refractive index of the layer 430, which in turn is higher than the refractive index of the exterior (e.g., air). Thus, the layers 410, 420, and 430 may provide refractive index matching between the light source 110 and the exterior of the light-emitting device 400. For example, the light-emitting device 400 can use a light source 110 having refractive index of 1.6 and emit light into air which has a refractive index of about 1.0. The layers 410, 420, and 430 can have refractive indexes of 1.55, 1.50 and 1.45 respectively. A person of ordinary skill in the art will appreciate that a refractive index matching layer can reduce total internal reflection and increase emission from the layer by increasing the critical angle, as determined by Snell's law. Accordingly, the efficiency of the light-emitting device 400 increases as the difference in refractive indexes between layers decrease and the critical angles increase.

In some embodiments, the thermal insulation matrix material in the layer 410 at least partially protects the luminescent matrix material in the layer 420 from the heat produced by the light source 110 to better maintaining thermal properties, such as light conversion efficiency and output wavelength, at or near optimal values. The thermal insulating matrix material of layer 410 can also be a material having a refractive index chosen to closely match that of the material of the light source 110. Layer 410 is therefore referred to herein as a thermal insulating and/or a refractive index matching layer. The thermal insulating material can comprise polymers, ceramics, glasses, mixtures thereof, as well as other suitable materials. Particular examples are the high-optical-quality polyimide materials supplied by Brewer Science, Inc. and Hitachi Chemical Co., Ltd. Among these commercially available high transparency polyimide materials, OptiNDEX B38 (Brewer Science) and PIQ 2200 (Hitachi Chemical) can be used as the thermal insulating material in this invention. OptiNDEX B38 and PIQ 2200 are curable liquids that can form a suitable film. Further information regarding thermal insulating materials that can be used in the present disclosure is described in the U.S. patent application Ser. No. 11/036,559, filed on Jan. 13, 2005 entitled "Light-emitting Device with a Thermal Insulating and Refractive Index Matching Material," which is incorporated by reference herein.

While some prior art light-emitting devices have sought to dissipate as much heat as possible through the phosphor-containing layers (e.g., luminescent matrix material in the layer 420), the body 120 can be configured to provide sufficient heat conduction such that it is not necessary to conduct heat through the phosphor-containing luminescent matrix materials in the layer 420. Thus, thermal insulation can be introduced into the layer 410 to shield the luminescent matrix materials in the layer 420 from thermal effects. For example, the package of the present disclosure can further use thermal techniques as described in the U.S. patent application Ser. No. 11/260,101, filed on Oct. 26, 2005 entitled "Method of Manufacturing Ceramic LED Packages," which is incorporated by reference herein.

The matrix material in the layer 420 can include luminescent materials. Luminescent materials suitable for the present invention include both fluorescent materials (phosphors) and phosphorescent materials. Layer 420 is referred to herein as a phosphor layer when the matrix material includes a fluorescent material. Phosphors are particularly useful for LED-based white light sources. Common phosphors for these purposes include Yttrium Aluminum Garnet (YAG) materials, Terbium Aluminum Garnet (TAG) materials, ZnSeS+ materials, Silicon Aluminum Oxynitride (SiAlON) materials, silicate-based phosphor materials, and nitride-based phosphor materials including nitridosilicates such as $Sr_2Si_5N_8:Eu^{2+}$ (a red phosphor) and $SrSi_2O_2N_2:Eu^{2+}$ (a green phosphor). The matrix material in the layer 420 can include, for example, glass, silicone, polymer, epoxy, and plastic.

The matrix material in the layer 430 can serve as a protective or capping layer configured to enclose the cavity 130 from the top. Examples of the matrix material in the layer 430 include a protective layer, an adhesive layer, and a lens. The matrix material in the layer 430 can include, for example, glass, silicone, polymer, epoxy, and plastic. Suitable adhesives are described in U.S. patent application Ser. No. 11/796, 240, filed on Apr. 27, 2007 entitled "LED Packages with Mushroom Shaped Lenses and Methods of Manufacturing LED Light-Emitting Devices," which is incorporated by reference herein. In some embodiments, the matrix material in the layer 430 forms an adhesive layer configured to attach a lens to the body 120. Alternatively, matrix material in the layer 430 includes an optical lens, for example a Fresnel lens, for focusing the light emitted from the light-emitting device 400. The matrix material in the layer 420 is preferably transparent to a broad range of wavelengths emitted from the layer 420.

FIG. 4 shows a dispersion of beads 220 within the matrix material of the layer 420. It will be understood, however, that the matrix materials in the layers 410, 420 or 430 can include a dispersion of beads 220. In various embodiments, the beads 220 dispersed in the layer 410, 420, or 430 include, for example, glass, silicone, polymer, epoxy, and plastic. As discussed above, the refractive index for the beads 220 is different from the refractive index for the matrix material of the respective layers 410, 420, 430. Generally, the refractive index for the beads 220 is higher than the refractive index for the matrix material of the respective layers 410, 420, 430. In some embodiments, the range for the refractive index of the beads includes about 1.40-1.89. Typically the refractive index for the beads 220 is in the range of about 1.40-1.60. It may be appreciated by a person of ordinary skill in the art that each of the layers 410, 420, and 430 can include a dispersion of beads 220 that has the same or different refractive index as beads 220 in other layers.

As discussed above, the amount of beads 220 dispersed within the matrix material of the layers 410, 420, or 430 is typically greater than about 2 percent and less than about 20 percent by weight. However, the amount of beads dispersed within the matrix material of the layers 410, 420, and/or 430 can be in the range of about 1 percent to about 30 percent by weight. It may be appreciated by a person of ordinary skill in the art that each of the layers 410, 420, 430 can include an amount of beads 220 that is the same as, or differs from, an amount of beads 220 in another layer.

As discussed above, the size of the beads 220 includes the range of about 0.3 microns to about 20 microns. In some embodiments, the size of the beads 220 includes the range of about 0.5 microns to about 10 microns. It may be appreciated by a person of ordinary skill in the art that each of the layers 410, 420, and 430 can include a size of beads 220 that is the same as or differs from a size of beads 220 in other layers.

In some embodiments, the beads 220 comprise a glass having a first refractive index and are dispersed into matrix material in the layer 410, 420, or 430 comprising a glass having a second refractive index. A melting point for the glass of the beads 220 is higher than a melting point for the glass of the respective matrix material to facilitate mixing the beads 220 into the glass of the respective matrix material.

In some embodiments, the size and amount of beads 220 can be selected to control a coefficient of thermal expansion (CTE). For example, the layer 410 generally encapsulates and is subjected to heat generated by the light source 110. Moreover, as discussed above the layer 410 can provide a thermal barrier for the layer 420. The beads 220 dispersed in the matrix material in the layer 410 can be selected to reduce the CTE and enhance the thermal barrier. For example, glass beads dispersed into an epoxy matrix material can reduce the CTE of the epoxy.

Figure 5:
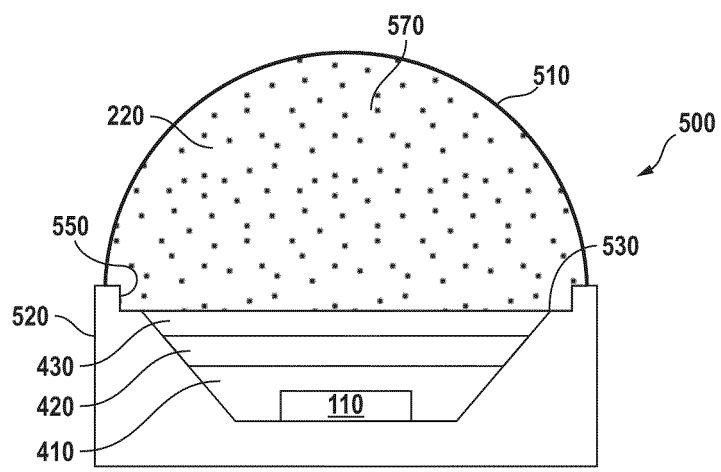
FIG. 5 is a cross-sectional view illustrating a lens on an exemplary light-emitting device according to an embodiment of the present disclosure.

FIG. 5 is a cross-sectional view illustrating a lens 510 on an exemplary light-emitting device 500 according to an embodiment of the present disclosure. The light-emitting device 500 includes a body 520 configured to attach to the lens 510. The body 520 includes a cavity 530, and a circular socket 550. The lens 510 includes a matrix material 570 and beads 220 dispersed in the matrix material 570, and is configured to be inserted into the socket 550. The socket 550 is configured to receive the lens 510 and beneficially provides a guide to center the lens 510 over the light source 110 during assembly. The layer 430 can include an adhesive which forms an adhesive layer configured to secure the lens 510. In some embodiments the lens 510 may be formed in place in the socket 550. See for example, U.S. patent application Ser. No. 11/796,240.

One method of placing a lens 510 on the light-emitting device 500 includes depositing a matrix material 570 comprising a liquid silicone onto the surface of the layer 430. The viscosity and surface tension of the silicone can control the height and a tendency of the silicone to flow across the surface of the layer 430. Moreover, a coating on the surface of the layer 430 can further control the flow of the silicone across the surface of the layer 430. For example, a coating on a perimeter region of the layer 430 can interact with the surface tension of the silicone to prevent flow of the silicone into the perimeter region where the coating has been deposited. Moreover, the coating can be deposited according a pattern configured to produce a desired shape for the lens 510. Alternatively, another type of coating can enhance the flow of the silicone across the coating into the perimeter region.

The matrix material 570 of the lens 510 can include any of the matrix materials used for the layers 210, 410, 420, and 430. Likewise, the proportions, materials, and properties of the beads 220 dispersed in the matrix material 570 can include any of the proportions, materials, and properties of the beads 220 dispersed in the matrix materials of the layers 210, 410, 420, and 430. FIG. 5 shows a dispersion of beads 220 within the matrix material 570 of the lens 510. It will be understood, however, that any or all of the matrix materials in the layers 410, 420, 430, and lens 510 can include a dispersion of beads 220. For example, all three layers 410, 420, 430, and the lens 510 can include silicone matrix material and glass beads. In some embodiments, refractive index matching between the light source 110 and the exterior of the light-emitting device 100 can be provided using, for example, a refractive index of 1.55, 1.50, 1.45, and 1.40 for the layers 410, 420, 430, and the lens 510 respectively.

Figure 6:
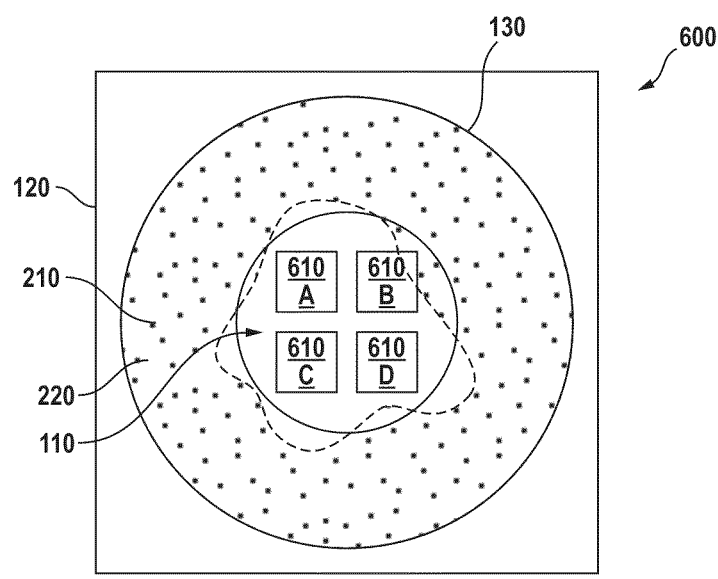
FIG. 6 is a top plan view of a light-emitting device illustrating multiple light source elements in accordance with another embodiment of the present disclosure.

FIG. 6 is a top plan view of a light-emitting device 100 illustrating multiple light source elements 610A, 610B, 610C, and 610D in accordance with another embodiment of the present disclosure. The light-emitting device 600 includes a matrix material 210 disposed in the cavity 130 and beads 220 dispersed in the matrix material 210. For clarity, the beads 220 and the matrix material 210 are omitted from a cutaway region bounded by a dotted line in the illustration. In some embodiments, the light source elements 610A, 610B, 610C, and 610D include monochromatic LEDs. For example, in configuring an "RGGB" light source 110, the light source element 610A can be a monochromatic red LED, 610B and 610C can be monochromatic green LEDs, and 610D can be a monochromatic blue LED.

Although in principle any number of light source elements may be disposed in the light-emitting device 600 of the present invention, four light source elements 610A, 610B, 610C, and 610D comprising LEDs are illustrated. The four LED light source elements 610A, 610B, 610C, and 610D can be the same or different, and in some embodiments are independently operable. In some embodiments, the multiple LED light source elements 610A, 610B, 610C and 610D are selectively operable and can be operable in any combination. For example, the current to the respective light source elements 610A, 610B, 610C and 610D can be independently adjusted to provide a desired color, including white.

Figure 7:
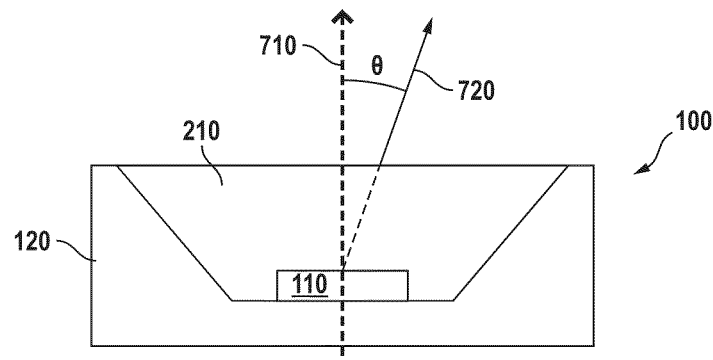
FIG. 7 shows a cross section ray diagram of light emitted from a light-emitting device.

FIG. 7 shows a cross section ray diagram of light emitted from a light-emitting device 100. A line representing a normal 710 is constructed through a center of the light-emitting device 100. However, the normal 710 can be placed anywhere in the light-emitting device 100. A ray 720 illustrates light emerging from the surface of the matrix material 210 of light-emitting device 100 at an emission angle θ with respect to the normal 710. The ray 720 emerging from the matrix material 210 as shown is extended through the matrix material 210 to intersect the normal 710. However, a person of ordinary skill in the art will appreciate that rays of light from the light source 110 may undergo multiple scattering before emerging from the matrix material 210 along a trajectory, parallel to the ray 720. The emission angle θ can span a range of angles. In some embodiments, the emission angle θ includes a range of −90 degrees to +90 degrees.

Figure 8:
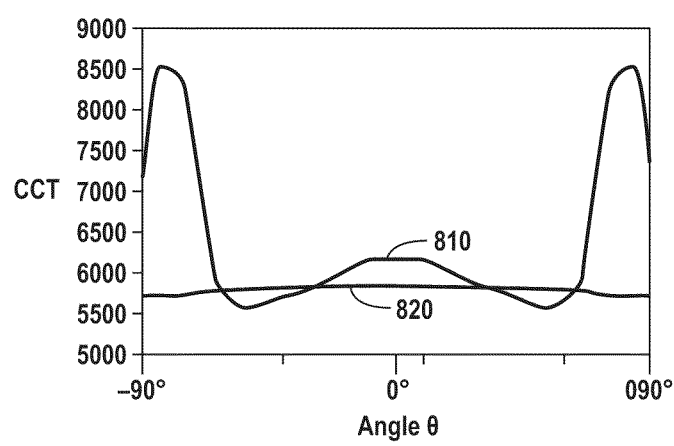
FIG. 8 is a graph illustrating a correlated color temperature (CCT) of the light emitted from the light-emitting device of FIG. 7 as a function of an emission angle θ.

FIG. 8 is a graph illustrating a correlated color temperature (CCT) of the light emitted from the light-emitting device 100 of FIG. 7 as a function of an emission angle θ. The vertical axis represents the CCT and the horizontal axis represents the emission angle θ for the emitted light. The horizontal axis in FIG. 8 illustrates a range of emission angles θ of −90 degrees to +90 degrees. The line 810 illustrates a CCT as a function of the emission angle θ for light-emitted from a light-emitting device according to the prior art. The CCT of the line 810 varies substantially as a function of the emission angle θ and the variation is generally visible as a perceptible color difference when observing prior art light-emitting device at various emission angles θ. For example, light from the prior art light-emitting device appears red from some angles θ and blue from other angles θ, while from directly above the device (θ=0) the light may appear white. Shadows cast by the prior art light-emitting device without beads can have color variations at the edges of the shadows.

The line 820 illustrates the CCT as a function of the emission angle θ for a light-emitting device 100 using beads 220 (not illustrated in FIG. 7) dispersed in the matrix material 210. The CCT is substantially constant as a function of the emission angle θ. Variations in the color are not perceptible at various emission angles θ about the light-emitting device 100. For example, the light emitted from the light-emitting device 100 appears white when viewed from various different angles, including directly above (θ=0). Shadows cast by the light-emitting device 100 typically have no perceptible color variation at the edges.

Figure 9:
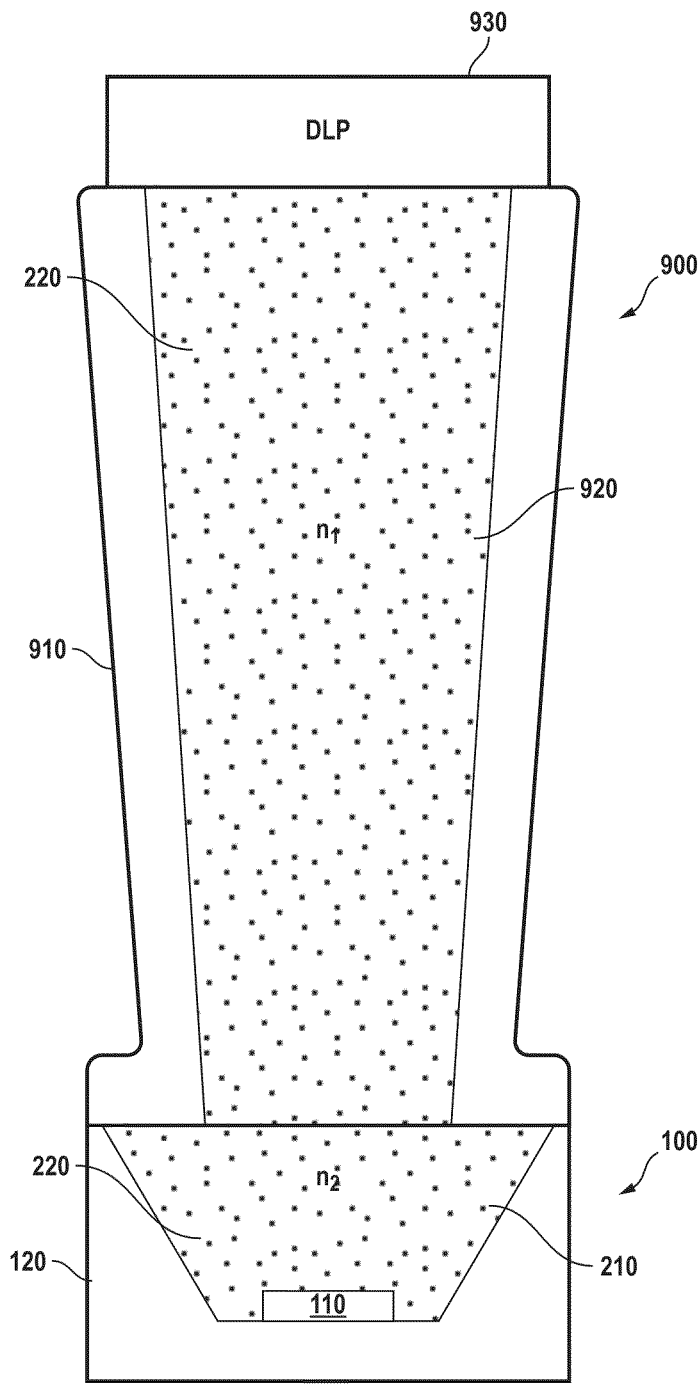
FIG. 9 illustrates a light tube for coupling light from a light-emitting device to a digital light processor (DLP)

FIG. 9 illustrates a light tube 900 for coupling light from the light-emitting device 100 to a digital light processor (DLP) 930. The light tube 900, also referred to as a light pipe, includes a body 910 and a matrix material 920. The light emitted from the light-emitting device 100 can be coupled to the DLP 930 via the matrix material 920 of the light tube 900.

Beads 220, for example glass beads, can be dispersed in the matrix material 920 of the light tube 900 to increase the luminance and color uniformity of the light transmitted to the DLP 930 from the light-emitting device 100. In various embodiments, the matrix material 920 includes, for example, glass, silicone, polymer, epoxy, and plastic, having a refractive index of n1. The matrix material 210 of the light-emitting device 100 has a refractive index of n2. Generally, the refractive index n1 of the matrix material 920 is about equal to the refractive index n2 of the light-emitting device 100 to improve efficiency of light collection from the light source 110. Beads 220 can also be dispersed in the matrix material 210 of the light-emitting device 100 to increase the luminance and color uniformity of the emitted light.

While the light-emitting device 100 illustrated in FIG. 9 depicts a matrix material 210 having one layer, a person of ordinary skill in the art will appreciate that the light-emitting device 100 can include multiple layers of matrix material and beads 220 can be dispersed in any or all of the layers. For example, the light-emitting device 100 can include three layers as in the light-emitting device 400 (FIG. 4), and all three layers can include glass beads 220 dispersed in a silicone matrix material of varying indices of refraction. The silicone matrix material of the layer adjacent the light tube 900 can have a refractive index n2 equal to the refractive index n1 of the matrix material 920.

Figure 10:
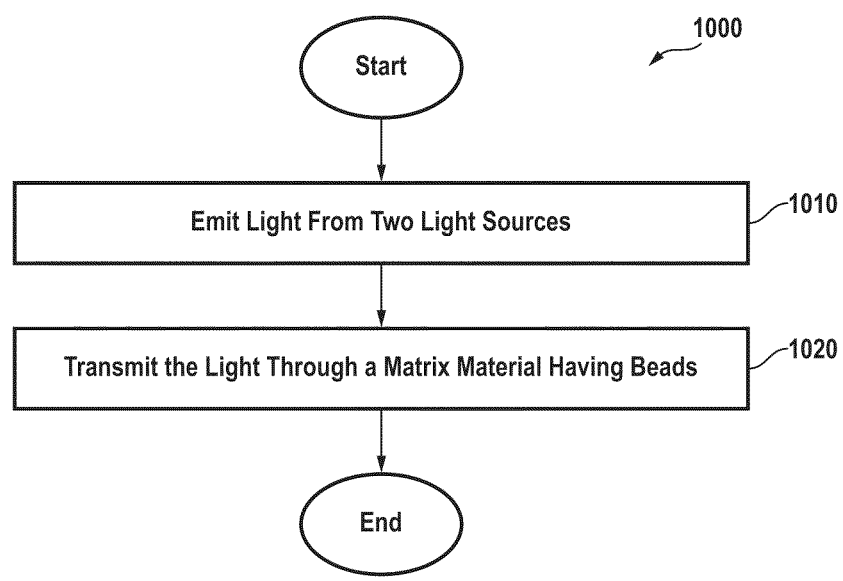
FIG. 10 depicts a method according to an exemplary embodiment of the invention.

FIG. 10 depicts a method 1000 according to an exemplary embodiment of the invention. Method 1000 comprises a step 1010 of emitting light from two light sources disposed on a support, and a step 1020 of transmitting the light through a matrix material having a first refractive index and beads having a second, different, refractive index dispersed within the matrix material.

In another embodiment, the present invention provides a lens that is configured to provide substantially centered light output even when a light source is placed off the optical axis of the lens. In some embodiments, the present invention also provides lighting apparatus that incorporate such a lens.

Figure 11:
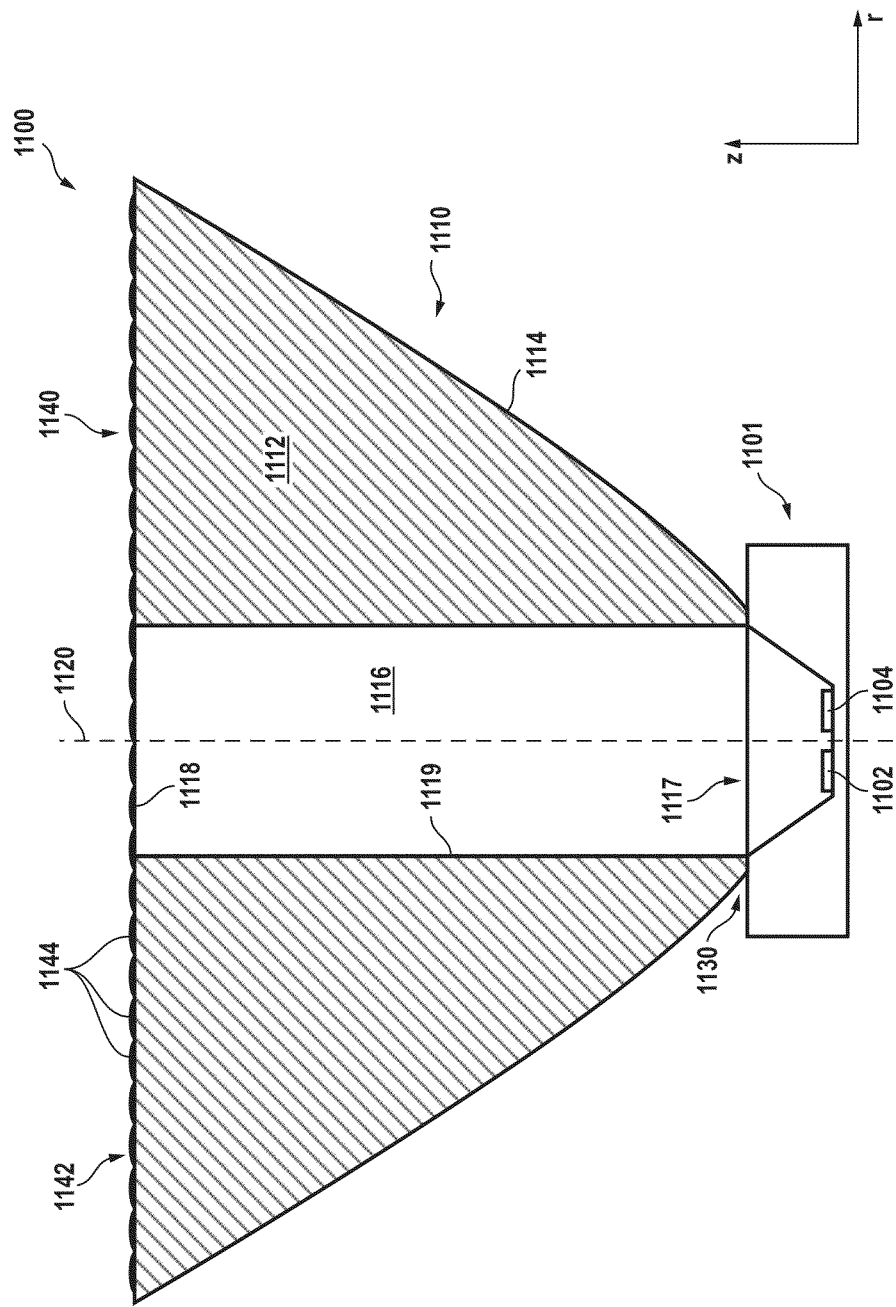
FIG. 11 is a simplified cross-sectional view diagram illustrating a lighting apparatus including a lens and a light source according to an embodiment of the present invention.

FIG. 11 is a simplified cross-sectional view diagram illustrating a lighting apparatus including a lens and a light source according to an embodiment of the present invention. As shown, lighting apparatus 1100 includes light source 1101 and lens 1110. Lens 1110 has an optical axis 1120. In embodiments of the present invention, the lens is configured to provide substantially centered projected light even when the light source is positioned off the optical axis.

Depending on the embodiments, lens 1110 can be made of different material, e.g., glass or transparent plastic such as PMMA (Polymethylmethacrylate). Of course, other materials having a suitable refractive index and transparency can also be used.

In a specific embodiment, lens 1110 has a body member 1112, which has an outer surface region 1114 and an interior open channel 1116 that extends longitudinally through the body member 1112. Body member 1112 and interior open channel 1116 are substantially symmetric with respect to optical axis 1120. In an embodiment, the outer surface region 1114 is shaped to provide total internal reflection.

As shown in FIG. 11, body member 1112 has a first end surface region 1130 at a first end 1117 of open channel 1116 for accommodating a light source. Body member 1112 also has a second end surface region 1140 at a second end 1118 of open channel 1116 opposite the first end surface region 1130. The second end surface region 1140 has a circular surface 1142 including a plurality of refractive regions 1144 positioned around the second end 1118 of open channel 1116.

In some embodiments, interior open channel 116 is characterized by a substantially cylindrical sidewall 1119. In some embodiments, the cylindrical sidewall surface extends from the first end 1117 to the second end 1118 of open channel 1116 without bending. According to a specific embodiment, the substantially straight side wall can provide more reflection and better mixing of light in the open channel. Therefore in some embodiments, it is desirable for the open channel side wall to have no bending or angles. In some embodiments, long and narrow open channels can provide better light reflection and mixing. Substantially cylindrical side wall 1119 can be slightly tapered (e.g., 1 degree or less or 5 degrees or less) such that the opening at first end 1117 is slightly smaller than the opening at the second end 1118.

In certain embodiments, the interior open channel 1116 is provided for collimating light in the center region. The total-internal-reflection surface 1114 can prevent light loss, and the multiple refractive surface regions 1144 can distribute light uniformly. In some embodiments, the multiple refractive surface regions 1144 in end region 1140 of lens 1110 can have hexagon or honeycomb shapes. The size of the hexagon in the honeycomb pattern can be optimized experimentally.

In certain embodiments, one end of the open channel can be slightly larger than the other. For example, the a cross-sectional profile of the cylindrical sidewall 1119 can form a small angle, e.g., 1 degree, relative to optical axis 1120. The slightly expanding open channel can simplify the process of making the lens. For example, the lens can be manufactured using a plastic molding process, and the slightly slanted side wall can facilitate the separation of the lens and the mold.

According to embodiments of the present invention, the outer surface 1114 of lens 1110 are shaped to provide total-internal-reflection. In an embodiment, the shape of outer surface 1114 can be described by the following equation.

$$z = \frac{cr^2}{1 + \sqrt{1 - (1+k)c^2 r^2}} \quad (1)$$

In the above equation, z denotes the longitudinal coordinate (=0 is the plane of first end region 1117), and r is the radius measured from the optical axis 1120, as shown in the coordinates in the lower right hand corner of FIG. 11. The curvature c and conic constant k are adjustable parameters.

Depending on the embodiments, lighting apparatus 1100 can employ incandescent, sapphire crystal, fluorescent, or LED light sources that operate over the range of wavelengths from ultraviolet (UV) to Infrared (IR) which covers the range from about 200 to 2000 nanometers. In some embodiments, light source 1101 can include a light-emitting diode (LED). For example, light source 1101 can include an LED-based light source as described above in connection with FIGS. 1-10. In some embodiments, light source 1101 can include multiple LEDs.

For example, light source 1110 can include four LEDs in a configuration similar to that described above in connection with FIG. 6. In this four-LED configuration, light source 1101 in FIG. 11 shows the cross sections of two LEDs 1102 and 1104, both of which are positioned off the optical axis 1120. As described in detail below, lens 1110 is configured to provide substantially centered projected light even when the light source is positioned off the optical axis. In an example, light source 1101 includes a red LED, a green LED, a blue LED, and an amber LED, and the lens is configured to provide substantially centered white light.

In a specific embodiment, the light source includes a light-emitting diode (LED) and a matrix material having a first refractive index overlying the LED. Beads can be dispersed within the matrix material, the beads having a second refractive index different from the first refractive index. Examples of such matrix material are describe above in connection with FIGS. 1-10.

In order to confirm the concept of lighting apparatus and lens described above, we have performed various experiments. Some of the results are summarized below. In one experiment, a light source includes four LED dice, each configured to emit a different color, red, green, blue, and amber, respectively. The dimension of each die is approximately 1 mm by 1 mm. The four LEDs are positioned in a 10 W reflective cup in a configuration similar to that shown in FIG. 6. The spacing between adjacent LEDs is approximately 0.1 mm. A lens similar to lens 1110 in FIG. 11 is designed for this configuration with approximate dimensions of 25 mm in length and 34 mm in diameter, as described below.

FIG. 12A is a simplified cross-sectional view diagram illustrating a lens 1200 according to an embodiment of the present invention. The general structure of lens 1200 is similar to that of lens 1110 described above in connection with FIG. 11. FIG. 12A provides physical dimensions of lens 1200 in a specific embodiment of the invention. FIG. 12B is simplified top view diagram of lens 1200 according to an embodiment of the present invention. In particular, FIG. 12B illustrates a plurality of refractive surface regions 1244 positioned around the end region 1218 of the open channel.

FIG. 13 shows an equation that describes an outer surface of a lens according to an embodiment of the present invention. As in Equation (1) above, z denotes the longitudinal coordinates, r is the radius measured from the optical axis, c is the curvature, and k is the conic constant. For lens 1200 of FIG. 12, c=0.3 and k=−1.1381. FIG. 14 lists tolerances for total-internal-reflection (TIR) lens 1200 of FIG. 12 according to a specific embodiment of the present invention.

Figure 12:
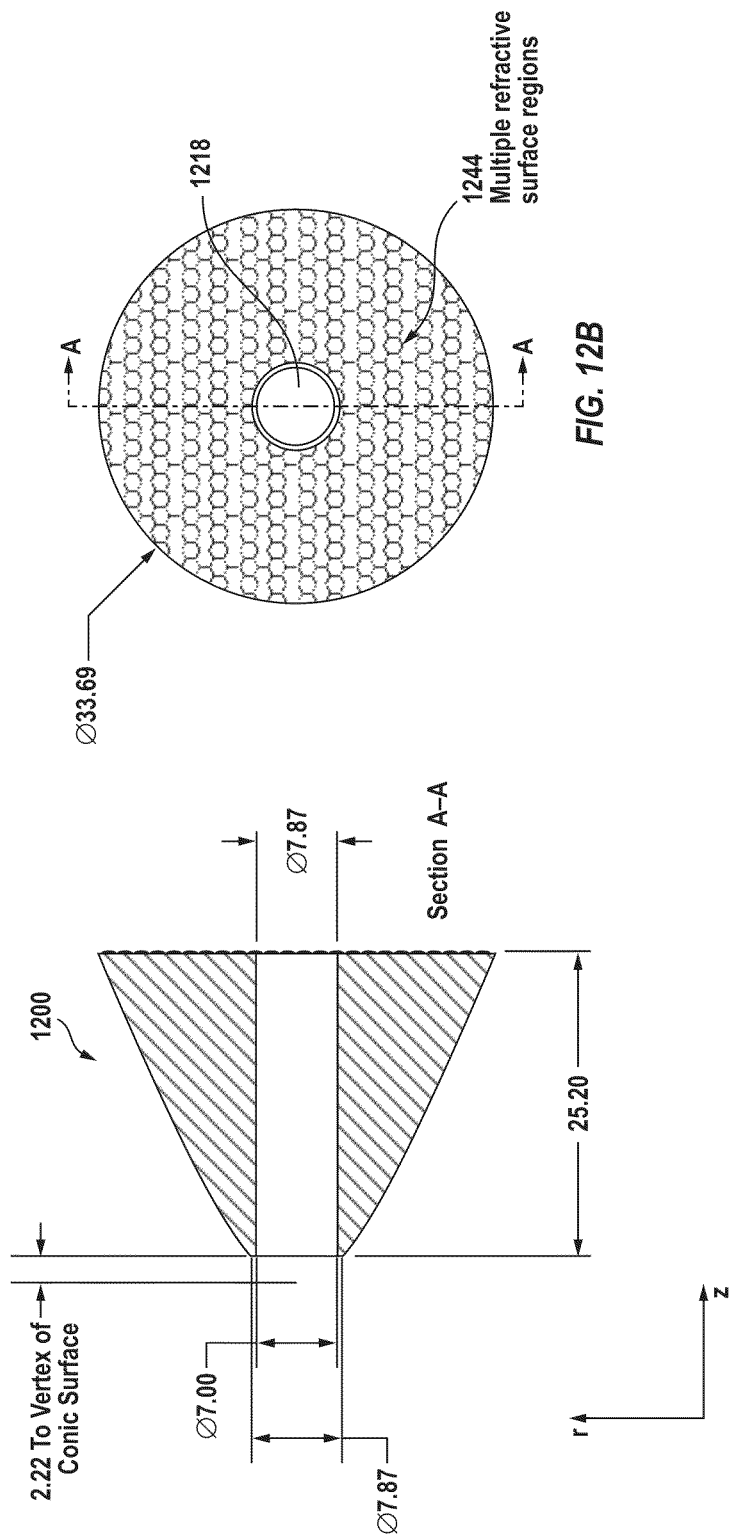
FIGS. 12A and 12B are simplified cross-sectional view diagrams illustrating a lens according to an embodiment of the present invention.
Figure 15:
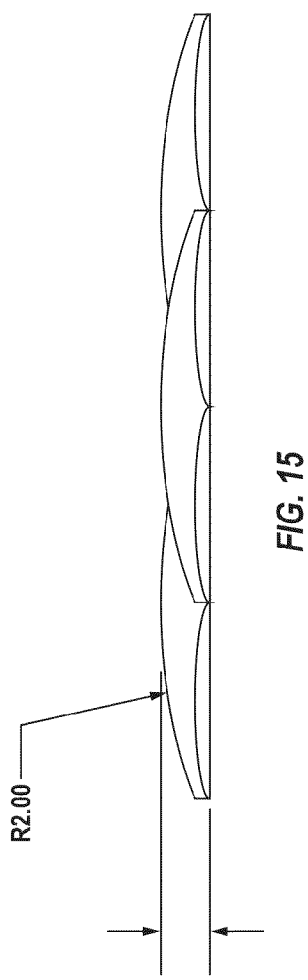
FIG. 15 is a simplified cross-sectional view diagram illustrating multiple refractive surfaces in a surface region of a lens according to an embodiment of the present invention.
Figure 16:
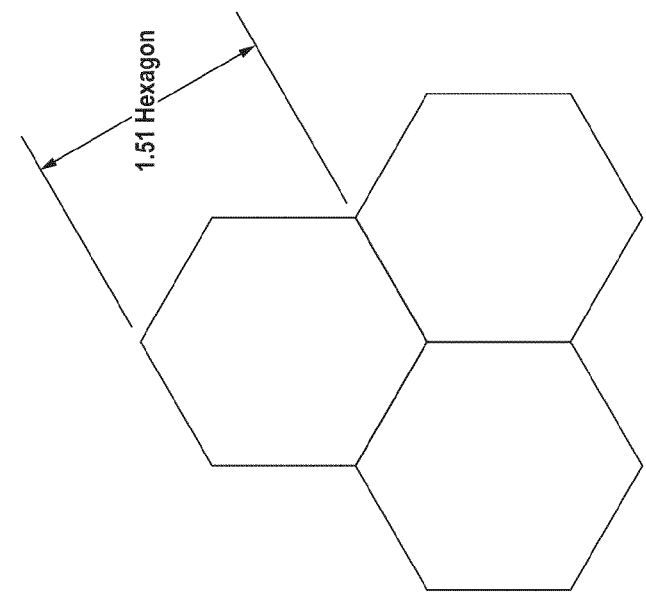
FIG. 16 is a simplified top view diagram illustrating multiple refractive surfaces in a surface region of a lens according to an embodiment of the present invention.
Figure 18A:
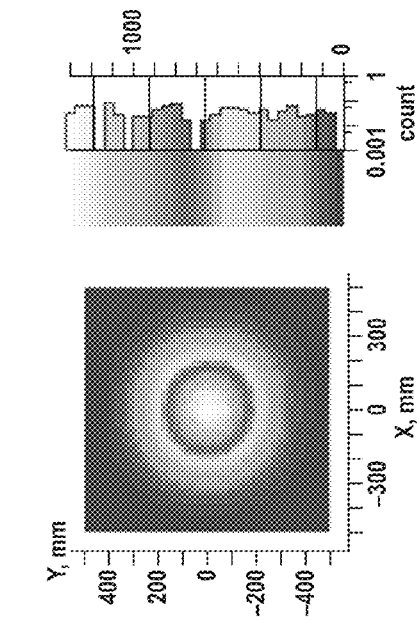
FIGS. 18A-18D are simplified raster charts illustrating light intensity for four LEDs located in four different off-axis positions, respectively, in according to an embodiment of the present invention.
Figure 18B:
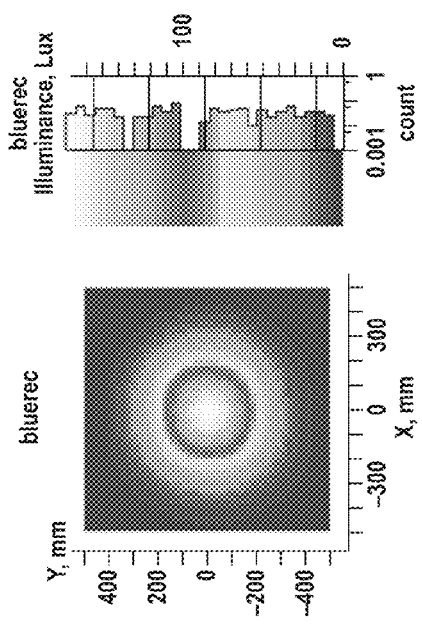
Figure 18C:
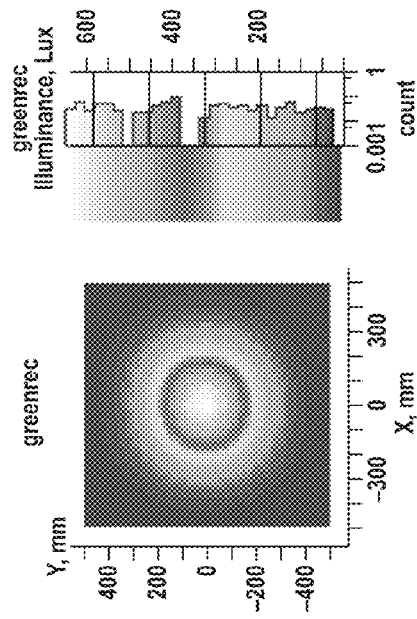
Figure 18D:
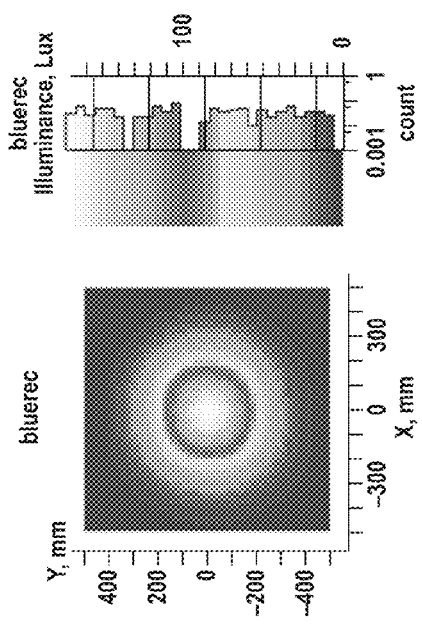

FIG. 15 is a simplified cross-sectional view diagram illustrating multiple refractive surfaces 1244 in a surface region of lens 1200 of FIG. 12B according to an embodiment of the present invention. FIG. 16 is a simplified top view diagram illustrating multiple refractive surfaces 1244 in a surface region of lens 1200 of FIG. 12 according to an embodiment of the present invention. In this particular embodiment, the refractive surface regions are microlenses that are hexagonal in shape and are arranged in a honeycomb pattern. Each hexagonal microlens has convex curvature as shown in FIG. 15. Of course, there can be other variations, modifications, and alternatives. The dimensions in these figures, as in other figures herein, are in mm unless otherwise noted.

In order to confirm the performance of lens 1200, four surface detectors are used to detect light on a flat target surface at about 1 m from the lighting apparatus. Each detector uses two filters to collect rays of only red, green, blue, or amber spectra. A total of 100 million rays are traced, and the full width at half maximum (FWHM) view angle is about 23 degrees. The figures below illustrate line cross sections and the surface intensity distribution for each color.

FIGS. 17A-17D are simplified line charts illustrating light intensity for four LEDs located in four different off-axis positions, respectively, in a lighting apparatus according to an embodiment of the present invention. The vertical axis indicate luminance intensity in Lux, and the horizontal axis indicates position, approximately −400 mm to 400 mm from a center point. As shown, the light patterns for all four LEDs, red, blue, green, and amber, all are substantially centered, even though all of the LEDs are placed off the optical axis.

FIGS. 18A-18D are simplified raster charts illustrating light intensity for four LEDs located in four different off-axis positions, respectively, according to an embodiment of the present invention. In each figure, light intensity is shown as a two-dimensional raster chart, with corresponding Lux value for each color shown to the right of the raster chart. Again, the light patterns are substantially centered for all four LEDs.

Figure 19B:
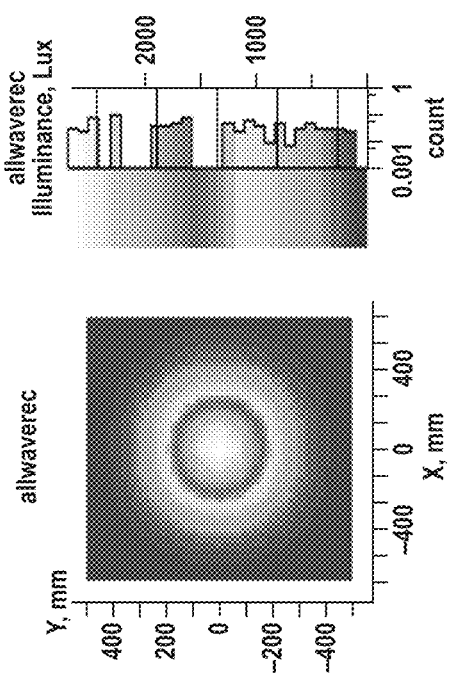
FIG. 19B is a simplified raster chart illustrating total light intensity of a lighting apparatus having four LEDs located in four different off-axis positions according to an embodiment of the present invention.
Figure 19A:
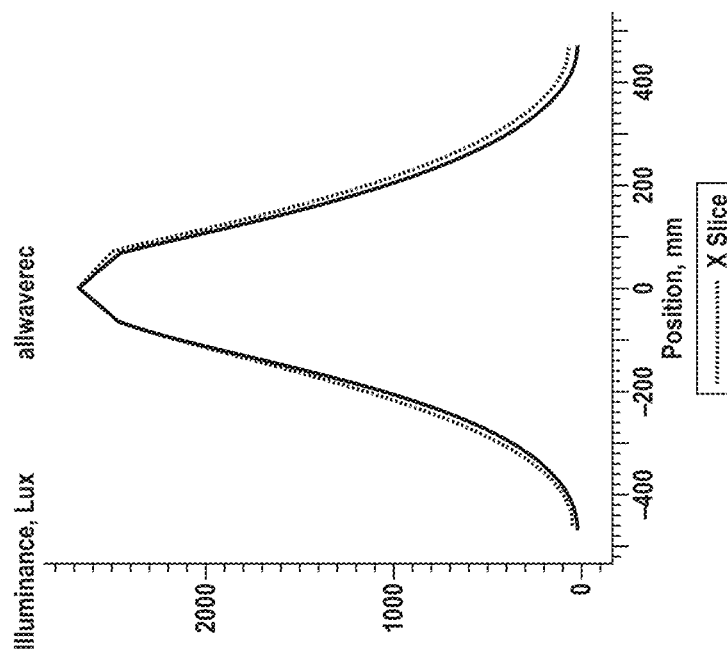
FIG. 19A is a simplified line chart illustrating total light intensity of a lighting apparatus having four LEDs located in four different off-axis positions according to an embodiment of the present invention.

FIG. 19A is a simplified line chart illustrating total light intensity of a lighting apparatus having four LEDs located in four different off-axis positions according to an embodiment of the present invention. Here, all four LEDs are turned on. It can be seen that the combined light pattern is substantially centered.

FIG. 19B is a simplified raster chart illustrating total light intensity of a lighting apparatus having four LEDs located in four different off-axis positions according to an embodiment of the present invention. Again, the combined light output of the four LEDs is substantially centered.

Many benefits can be achieved by embodiments of the present invention. As shown in FIGS. 12A-19B, the lighting apparatus incorporating 10 W RGBA (red, green, blue, and amber) LEDs with mixing TIR lens 1200 produces substantially centered light output with strong intensity. Moreover, the wavelength distribution of an RGBA LED using this lens is uniform across the light field. Thus embodiments of the present invention can provide superior performance compared with convention devices. Embodiments of the present invention provide much more uniform color distribution with high optical efficiency. In the experiment described above, an optical efficiency is determined to be approximately 70%, and the symmetry of the light output for each color is greater than 90%.

In contrast, conventional color mixing lenses often can not simultaneously provide good light mixing uniformity with high optical efficiency. Trade-offs often are made that can sacrifice one performance parameter or the other. For example, some conventional devices use diffusers to improve light mixing at the expense of optical efficiency. As a result, conventional lenses tend to provide poor light mixing or have low optical efficiency (e.g., ~40%).

In some embodiments, the invention provides a method for providing uniform light color mixing. As shown in FIGS. 19A and 19B, a lighting apparatus having a combination of four LEDs can provide centered light. Additionally, the intensity of each LED can be adjusted, e.g., electrically, to obtain various light combinations. In a specific embodiment, four LEDs (red, green, blue, and amber) can be used to provide substantially centered white light with good optical efficiency (e.g., ~70%).

In comparison, conventional devices having a secondary lens for a 4-LED (RGBA) package often exhibit four non-overlapping regions, each showing its own color. The center region where all four colors are available may show the mixed color, but the four edge regions tend to exhibit each individual color. Additionally, the edge regions are fairly large, and often in tilted oval or elliptical shapes because of the off-axis spatial positions of the individual LEDs.

While certain embodiments of the invention have been illustrated and described, those skilled in the art with access to the present teachings will recognize that the invention is not limited to these embodiments only. Numerous modifications, changes, variations, substitutions, and equivalents will be apparent to those skilled in the art. Accordingly, it is to be understood that the invention is intended to cover all variations, modifications, and equivalents within the scope of the following claims.

What is claimed is:

1. A lens, comprising:
   a body member having an outer surface and an interior open channel extending longitudinally through the body member, the body member and the interior open channel being substantially symmetric with respect to an optical axis, the outer surface being shaped to provide total internal reflection,
   the body member having a first end surface region at a first end region of the open channel for accommodating a light source and a second end surface region opposite the first end surface region and surrounding a second end region of the open channel, the second end surface region including a plurality of refractive surface regions positioned around the second end region of the open channel,
   wherein the lens is configured to provide collimated light substantially centered with respected to the optical axis when the light source is positioned off the optical axis.

2. The lens of claim 1 wherein the interior open channel is characterized by a substantially cylindrical sidewall.

3. The lens of claim 1 wherein a side wall of the interior open channel extends from the first end region to the second end region of the interior open channel substantially without bending.

4. The lens of claim 1 wherein a side wall of the interior open channel forms angle of approximately 1 degree with respect to the optical axis.

5. The lens of claim 1 wherein the multiple refractive surface regions comprise hexagonal shaped regions in a honeycomb arrangement.

6. The lens of claim 1 wherein the light source comprises a light-emitting diode (LED).

7. The lens of claim 1 wherein the light source comprises a light-emitting diode (LED), a matrix material having a first refractive index overlying the LED, and a dispersion of beads within the matrix material, the beads having a second refractive index different than the first refractive index.

8. The lens of claim 1 wherein the light source comprises four light-emitting-diodes.

9. The lens of claim 1 wherein the light source comprises a red LED, a green LED, a blue LED, and an amber LED, and wherein the lens is configured to provide substantially centered white light.

10. A lens, comprising:
    a body member having an outer surface and an interior open channel extending longitudinally through the body member, the body member and the interior open channel being substantially symmetric with respect to an optical axis, the outer surface being shaped to provide total internal reflection,
    the body member having a first end surface region at a first end region of the open channel for accommodating a light source and a second end surface region opposite the first end surface region and surrounding a second end region of the open channel, the second end surface region including a plurality of refractive surface regions positioned around the second end region of the open channel,
    wherein the lens is configured to provide collimated white light substantially centered with respected to the optical axis when the light source is positioned off the optical axis.

11. The lens of claim 10, wherein the light source comprises a plurality of LED dies, each of the LED dies being disposed off the optical axis.

12. The lens of claim 10, wherein the light source comprises a red LED, a green LED, a blue LED, and an amber LED.

13. The lens of claim 10, wherein the light source comprises a red LED, two green LEDs, and a blue LED.

14. The lens of claim 10, wherein the light source comprises a red LED, a green LED, and a blue LED.

15. A lens, comprising:
    a body member having an outer surface and an interior open channel extending longitudinally through the body member, the body member and the interior open channel being substantially symmetric with respect to an optical axis, the outer surface being shaped to provide total internal reflection,
    the body member having a first end surface region at a first end region of the open channel for accommodating a light source and a second end surface region opposite the first end surface region and surrounding a second end region of the open channel, the second end surface region including a plurality of refractive surface regions positioned around the second end region of the open channel,
    wherein the lens is configured to provide collimated white light substantially centered with respected to the optical axis, and wherein the light source comprises a red LED die, a green LE die, and a blue LED die, each of the LED dies being disposed off the optical axis.

16. The lens of claim 15, wherein each of the LED die comprises an LED chip without a primary lens, and the plurality of LED dies are mounted on a single substrate.

17. The lens of claim 15, wherein the light source further comprises n amber LED die or a second green LED die.

* * * * *